United States Patent [19]

Macovski

[11] Patent Number: 4,623,844
[45] Date of Patent: Nov. 18, 1986

[54] NMR INHOMOGENEITY COMPENSATION SYSTEM

[76] Inventor: Albert Macovski, 2505 Alpine Rd., Menlo Park, Calif. 94025

[21] Appl. No.: 514,578

[22] Filed: Jul. 18, 1983

[51] Int. Cl.$^4$ ............................................. G01R 33/20
[52] U.S. Cl. ....................................... 324/320; 324/313
[58] Field of Search ............... 324/307, 312, 313, 318, 324/319, 320; 128/653

[56] References Cited

U.S. PATENT DOCUMENTS

| | | | |
|---|---|---|---|
| 3,510,832 | 5/1970 | Golay | 324/320 |
| 3,564,398 | 2/1971 | Nelson | 324/320 |
| 4,284,950 | 8/1981 | Burl | 324/320 |
| 4,417,209 | 11/1982 | Hounsfield | 324/307 |
| 4,424,488 | 1/1984 | Hounsfield | 324/307 |

FOREIGN PATENT DOCUMENTS

| | | | |
|---|---|---|---|
| 2076540 | 12/1981 | United Kingdom | 324/307 |
| 2076542 | 12/1981 | United Kingdom | 324/307 |

*Primary Examiner*—Stephen A. Kreitman
*Assistant Examiner*—Scott M. Oldham
*Attorney, Agent, or Firm*—Flehr, Hohbach, Test, Albritton & Herbert

[57] ABSTRACT

The volume of interest is excited. An array of pickup coils with water cores provide an array of signals whose frequencies indicate the magnetic field distribution. These frequencies are estimated and used to produce controlled magnetic field inhomogeneities which substantially cancel the undesired inhomogeneities in the field. The control signals can be stored and updated with each subsequent excitation.

3 Claims, 5 Drawing Figures

4,623,844

NMR INHOMOGENEITY COMPENSATION SYSTEM

BACKGROUND OF THE INVENTION

1. Field of the Invention

This invention relates to medical imaging systems using nuclear magnetic resonance. In a particular application the invention relates to correcting the magnetic inhomogeneities which vary due to drift or environmental changes.

2. Description of Prior Art

Nuclear magnetic resonance, abbreviated NMR, represents a new approach to medical imaging. For general descriptions of the various imaging methods we can use a number of references including the books, NMR Imaging in Biomedicine by P. Mansfield and P. G. Morris, Academic Press and Nuclear Magnetic Resonance Imaging in Medicine, published in 1981 by Igaku-Shoin, Ltd. Tokyo or review papers including "NMR Imaging Techniques and Applications: A Review," by P. A. Bottomley, Rev. Sci. Instrum., vol. 53, September 1982, pp.1319-1337, and "Fourier Transform Nuclear Magnetic Resonance Tomographic Imaging," by Z. H. Cho, et al., Proceedings of the IEEE, vol. 70, October 1982, pp. 1152-1173. In these, various NMR imaging systems are described, each requiring a highly stable magnetic field because of the critical nature of the magnetic resonance. Subtle variations in these fields can cause either severe distortions or complete loss of the image. As a result of these severe stability requirements, most manufacturers have begun to use superconducting magnets, which are both expensive and difficult to maintain. They are also incapable of reasonably rapid field variations, which is desirable for some studies such as relaxation times as a function of frequency.

This problem of a severe stability requirement was addressed in UK Application GB No. 2076542A by Godfrey N. Hounsfield of EMI Limited. In this patent small pickup coils are used to sample the received signals on either side of the object being studied. The output from these coils form the demodulating signals for the signals received from the principle receiver coil. Thus magnetic field variations during the time signals are received are compensated for.

This approach, however, does not compensate for field variations which cause errors in the transmitter or excitation signals. Also, the method shown requires complex handling of the signals when projections are taken in different directions. At least four separate pickup coils are required, preferably a pair for each projection angle, or a single pair of pickup coils which are rotated for each projection angle.

The problem of errors in the excitation signals was solved in a U.S. patent application Ser. No. 476,474 by the same inventor filed Mar. 18, 1983. Here, following a first excitation signal, the frequency of a reference signal is estimated and used to determine the frequency of a second excitation signal. This insures that the correct plane is excited, independent of drift in the field.

These methods, however, do not compensate for inhomogeneities in the magnetic field which can cause both distortions and artifacts. These inhomogeneities are usually "shimmed" or compensated for using various electromagnetic coils and metallic structures. However, this skimming operation cannot account for changes in the inhomogeneity due to drifts in the field or changes in the environment. Environmental changes are usually avoided by planning the NMR imaging instrument in a larger region where the environment can be carefully controlled. This, however, represents a substantial cost in the inefficient use of space.

SUMMARY OF THE INVENTION

An object of this invention is to provide an NMR imaging system where the undesired field inhomogeneities are corrected.

A further object of this invention is to provide an automatic method of correcting field inhomogeneities.

A further object of this invention is to provide an automatic method of exciting the desired plane independent of field homogeneities.

Briefly, in accordance with the invention, the region being studied is excited. The frequencies of an array of pickup coils are measured. The measured frequency information is processed and used to control corrective magnetic fields to compensate for field inhomogeneities. The system can be operated in a closed loop fashion where the control signals are stored and upated during each subsequent excitation.

BRIEF DESCRIPTION OF THE DRAWINGS

For a more complete disclosure of the invention, reference may be made to the following detailed description of several illustrative embodiments thereof which is given in conjunction with the accompanying drawings, of which.

DESCRIPTION OF THE PREFERRED EMBODIMENT

Figure 1:
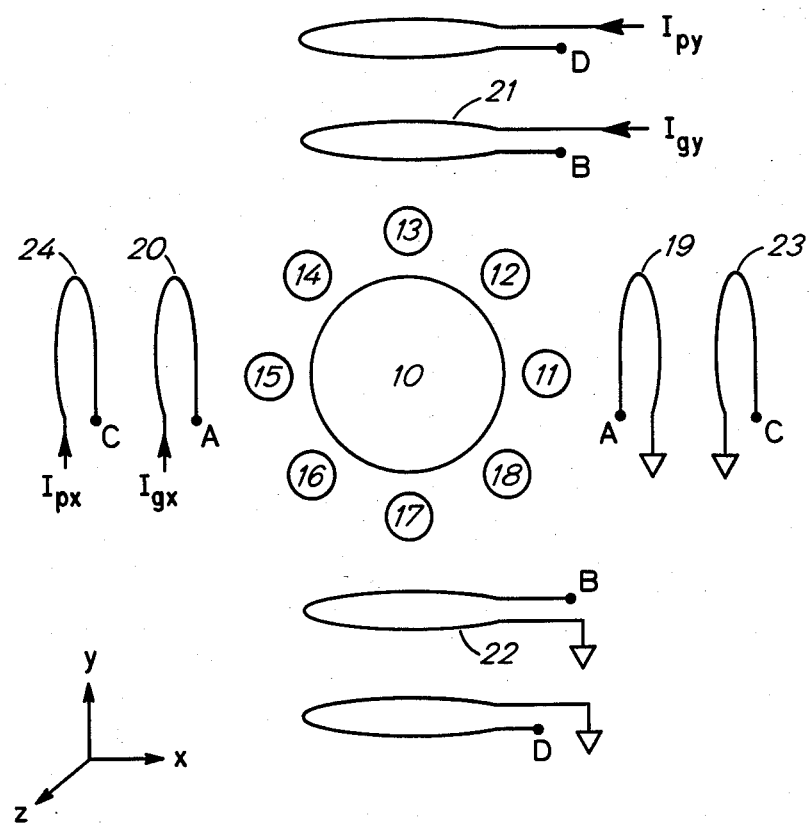
FIG. 1 is a schematic drawing of an embodiment of the invention.
Figure 2:
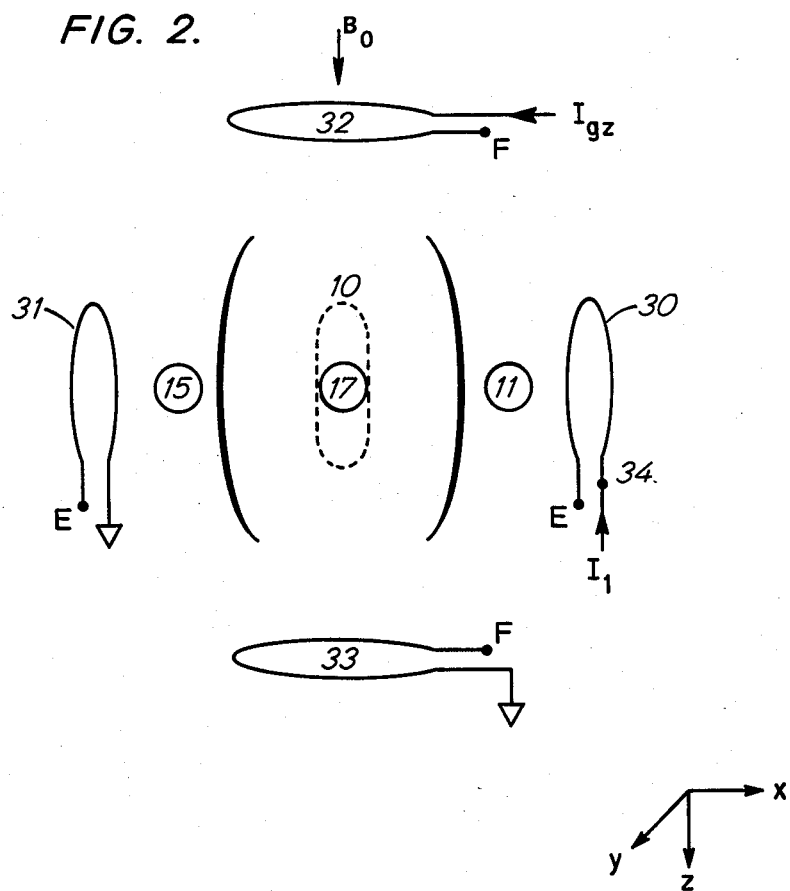
FIG. 2 is a schematic drawing illustrating a side view of an embodiment of the invention.

An understanding of the broad aspects of the invention may best be had by reference to FIGS. 1 and 2 where an NMR image is desired of object 10. As is conventional, the main field $B_0$ is shown along the z axis. The radio frequency coils 30 and 31 produce a substantially uniform r.f. field along the x axis, perpendicular to $B_0$. These are driven by current $I_1$, usually in the form of an r.f. burst which rotates the magnetic moment into the xy plane where free induction decay signals are received using the same coils.

To facilitate the exciting of a plane of interest, z gradient coils 32 and 33 are shown. As with all of the pairs of letters shown, A-F, there are simply convenient ways of representing connections. As with any gradient configuration, coils 32 and 33 are connecting in bucking fashion thus producing a field which varies substantially linearly in the z direction, having a null plane between coils 32 and 33. In typical fashion a current $I_{gz}$ is applied to these coils to create a gradient in the z direction in the presence of an r.f. burst, $I_1$. This insures that one planar section, corresponding to the frequency of the r.f. burst, is excited. The position of the section is determined by the basic equation $\omega = \gamma H$ where $\omega$ is the excitation frequency, $\gamma$ is the magnetogyric ratio for protons and $H$ is the magnetic field given by $H = B_0 + G_z z$ where $G_z$ is the z gradient. Thus some plane $z_0$ will correspond to the frequency $\omega$.

As indicated in U.S. application Ser. No. 476,474, due to various inaccuracies and drifts the excitation frequency may not correspond with the selected plane. This problem is solved in Ser. No. 476,474 by a dual excitation system where the frequency of the FID resulting from the initial excitation is measured and used to determine the frequency of the second excitation. Although this invention solved the problem of drifts in the main field, it did not address the problem of inhomogeneities in the field. These can be caused by geometric distortions in the main magnet or various changes in the environment caused by the movement of metal objects.

If inhomogeneities are not corrected, a number of problems result. Firstly, the selected section is distorted and not in the anticipated position. In addition a variety of artifacts and loss of resolution can occur, depending on the particular image reconstruction scheme used. In this invention, a method is shown of measuring the inhomogeneities and using that information to generate cancelling fields.

As shown in FIG. 1, an array of small coils are positioned around the object being studied. The position of these coils are shown as numbers 11 to 18. Each coil has a water core whose size is approximately that of a voxel or resolution element. The axis of each coil is perpendicular to the z axis so that it will produce the same type of receiver signals as that of the main receiver coils 30 and 31. The signals from the coils, however, represent the activity of the small water core within the coil. As such, the frequency of the signals in each coil represent the strengths of the local magnetic field. Therefore, the array of frequencies of the signals in coils 11–18 represent the field distribution. If these coils surround a single section, they should all be of the same frequency. As indicated, however, various changes in the magnetic environment can cause inhomogeneities. These will be indicated by the frequency distribution of the signals in coils 11–18.

Most of the existing NMR section imaging systems excite a single section by using a narrow beam r.f. burst $I_1$ in the presence of a z gradient $I_{gz}$. In this way, only the desired section is excited. Different sections are excited using different burst frequencies. The pickup coils 11–18 can respond to signals from all of these sections if they are elongated in the z direction to include the extent of the volume of interest as shown by the dashed line around pickup coil 17. The cross-sectional area of the core is approximately that of a pixel. Alternatively, broadband excitation bursts $I_1$ can be used which excite the entire volume of interest, enabling the use of the small coils.

In general, when an NMR imaging system is installed, the field is made quite uniform using shimming coils and various metal structures. However, as indicated, many environmental changes and drifts in the magnet can cause inhomogeneities. These changes, in general, are relatively small. As with any distribution they can be divided into symmetric or even components and asymmetric or odd components. The odd component is most often a gradient-like function varying linearly across either or both dimensions. The even component is usually near-parabolic. In this invention, the array of frequency measurements are used to control compensating odd and even components in both dimensions to restore homogeneity.

Coils 19 and 20 provide the compensating odd, asymmetric or gradient component in the x direction while coils 21 and 22 provide the odd component in the y direction. These are driven with bucking fields. These could be separate from the gradient coils of the imaging system. Alternatively, they can represent the same coils as the imaging system with additional currents $I_{gx}$ and $I_{gy}$ applied for purposes of inhomogeneity compensation.

Coils 23 and 24 provide the even, symmetric or parabolic component in the x direction while coils 25 and 26 provide the even component in the y direction. These are driven with aiding fields. Each pair of coils are sufficiently separated from each other, as compared to their diameter, so that the resultant field is strongest nearest the coils and diminishes in the region between the coils, providing a parabolic type of distribution.

Figure 3:
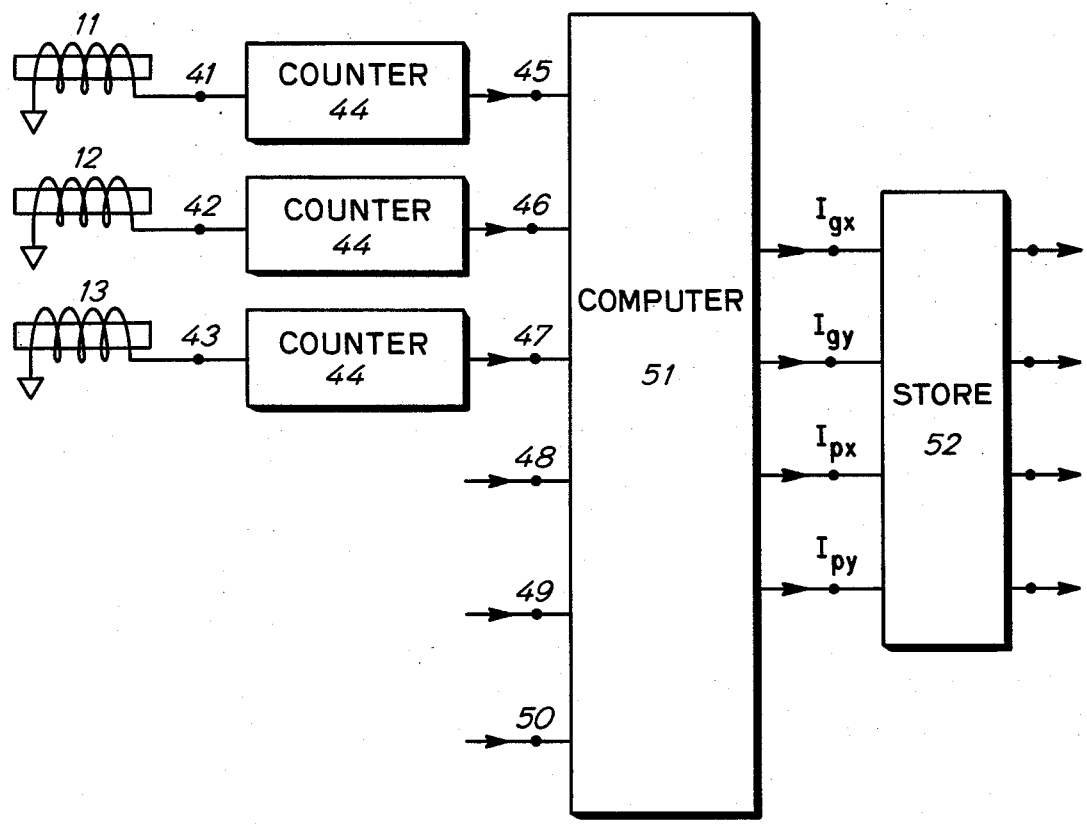
FIG. 3 is a block diagram of the data processing portion of the invention.

In operation, as shown in FIG. 3, the output signals of the coils are applied to a frequency estimation system. For illustrative purposes three coils are shown, 11–13, with output signals 41–43. These are each applied to counters 44 whose output represents the estimated frequency of each signal. The counter output signals 45–50, representing the local field strengths, are applied to computer 51. Here the required odd and even corrections in each dimension, $I_{gx}$, $I_{gy}$, $I_{px}$, and $I_{py}$, are calculated and applied to the appropriate coils as shown in FIG. 1. The control signals can be stored in storage structure 52 for use in subsequent excitations. The entire system can be operated as a control system where frequency measurements are taken periodically to update the stored values. If the field has remained homogeneous, no updating will be required and the stored values will be unchanged. Otherwise they will continue to change until the field is homogeneous.

Figure 4:
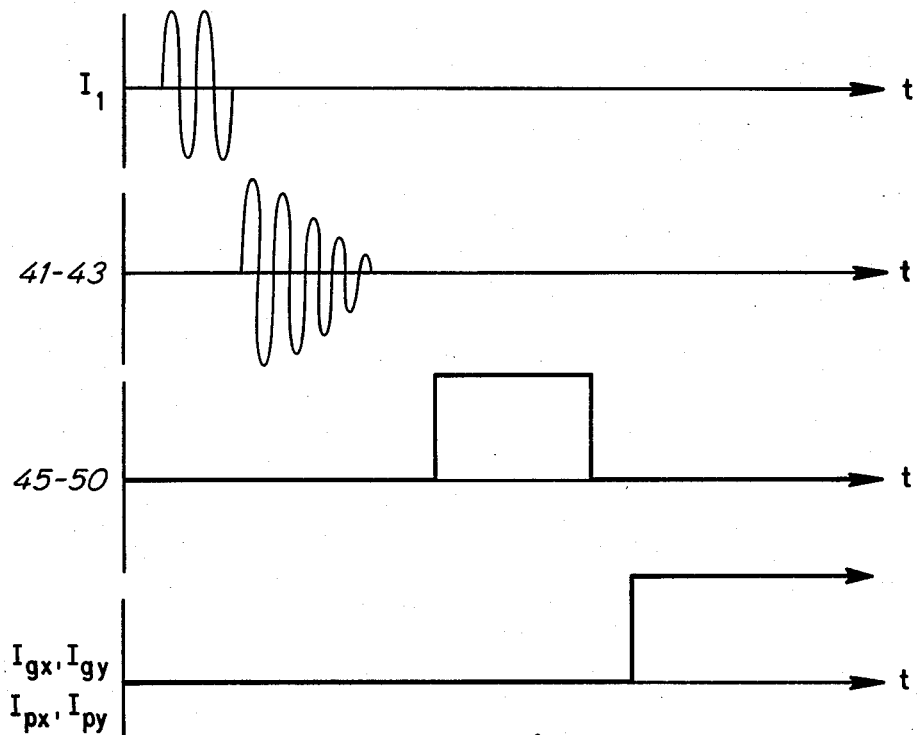
FIG. 4 is a set of waveforms illustrating an embodiment of the invention.

A simple waveform diagram is shown in FIG. 4. The volume is excited using r.f. burst $I_1$ resulting in each pickup coil producing an FID signal such as signals 41–43 shown in FIG. 4. Each of these are counted producing frequency or field estimates 45–50. These are applied to computer 51 to provide the correction signals.

The computer operation 51 calculates the odd and even components in each dimension from the field measurements. In general the inhomogeneous field B at any point can be given as $$B = Ax + Bx^2 + Cy + Dy^2 + B_0$$

where it is assumed that the inhomogeneities can be adequately approximated as linear and quadratic components in each dimension. It is desired to cancel these components so that only a uniform $B_0$, or $B_0$ some constant, remains. For simplicity in illustration we assume that the eight pickup coils 11–18 are positioned symmetrically at x,y positions ($\pm 2a, 0$), ($0, \pm 2a$), ($\pm a, \pm a$). Using the above equation we use the measured values to determine A, B, C and D. These measured values are given by:

at $-2a, 0$ $$B_1 = 2aA + 4a^2 B + B_0$$

at $a, -a$ $$B_5 = aA + a^2 B - aC + a^2 D + B_0$$

at $-a, a$ $$B_6 = aA + a^2B + aC + a^2D + B_0$$

The values for the odd or gradient components are readily calculated using $$B_1 - B_2 = 4aA$$

$$\therefore A = \frac{B_1 - B_2}{4a}$$

Similarly $B_3$ and $B_4$, measured at $0,2a$ and $0,-2a$ provide the gradient component in the y direction as $$C = \frac{B_3 - B_4}{4a}$$

The quadratic components B and D require the diagonal measurements as given by $$B = \frac{1}{16a^2}[B_3 + B_4 + 3(B_1 + B_2) - 4(B_5 + B_6)]$$

and $$D = \frac{1}{16a^2}[B_1 + B_2 + 3(B_3 + B_4) - 4(B_5 + B_6)]$$

Note that only one pair of diagonal coils at $(a,-a)$ and $(-a,a)$ were required. Thus the operation can be accomplished with six of the eight coils. The signals at the other diagonal pair $(a,a)$ and $(-a,-a)$, $B_7$ and $B_8$ will provide the same information since $B_7 + B_8 = B_5 + B_6$. They can be added for redundancy and accuracy and averaged together. These calculated values of A,B,C and D are used to generate $I_{gx}$, $I_{px}$, $I_{gy}$ and $I_{py}$ respectively to cancel the inhomogeneities. Once these are cancelled the undistorted imaging operation can take place.

The previously described homogeneity correction system, although perfectly adequate for NMR imaging considerations, may not be adequate for fine NMR spectroscopy where an unusually high degree of homogeneity is required. In "invivo" spectroscopy studies a small region of the volume is selected for spectroscopic analysis. This small region can be selected in a number of ways. One method, known as topical magnetic resonance, utilizes a small pickup coil adjacent to the region of interest. A more flexible system, known as the sensitive point system, involves the use of a.c. gradient signals where the null region of the a.c. gradients is the only region providing an output signal. This system is described in a paper by Waldo Hinshaw entitled "Image Formation by Nuclear Magnetic Resonance: The Sensitive-Point Method" in the Journal of Applied Physics, Vol. 47, August 1976, pp. 3709-3721.

If the localized region has a slightly inhomogeneous magnetic field, the resultant spectral spread diminishes the frequency resolution of the resultant NMR spectrum so that the desired lines are not well resolved. Over a very small sample region, the inhomogeneity can be approximated as being a linear variation. If this linear variation is cancelled, the desired spectrum is restored. When restored the spectrum is characterized by narrower and higher peaks. In the time domain, the corresponding signal has a longer duration corresponding to a longer $T_2^*$.

Figure 5:
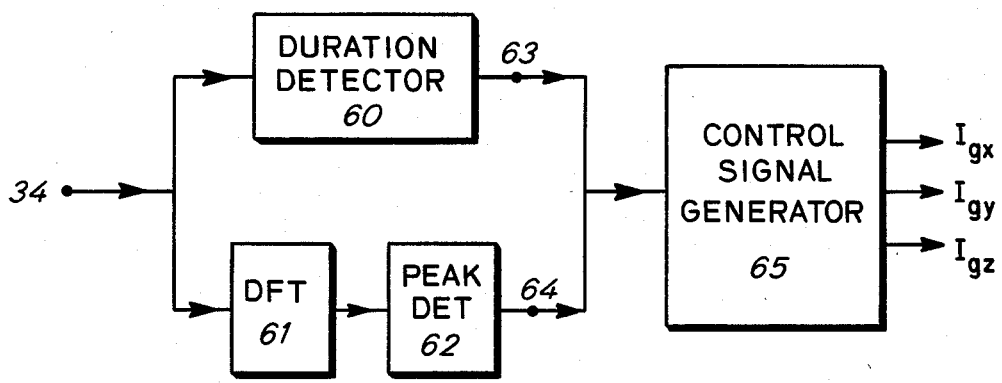
FIG. 5 is a block diagram of an alternate embodiment of the invention.

These parameters, height of the spectral peaks or duration of the FID signal, can be used to cancel the inhomogeneity as shown in FIG. 5. The received signal 34 is used for spectral analysis. This signal can be the FID following burst $I_1$ or alternatively can be a spin-echo signal following an inversion excitation. As shown in FIG. 5, one of two methods can be used to indicate spectral purity.

In the upper path, the spectral quality is indicated by the duration of the FID or spin echo signal 34. Duration detector 60 produces a voltage 63 indicative of the effective duration of signal 34. This detector system can consist of a rectifier followed by a threshold circuit which produces a pulsed output only when the rectified signal exceeds a preset threshold. The duration of this fixed amplitude pulse is then measured using an integrator such as a capacitor. The integrated output 63 represents the spectral purity. It is applied to control signal generator 65 which controls the currents through the gradient coils. The system then operates in the classical way in which closed loop control systems maximize some parameter. Each current $I_{gx}$, $I_{gy}$ and $I_{gz}$ is individually changed in some direction and the output of the duration detector 63 is observed. If it decreases, the current direction is reversed. Each current or gradient is then changed until a maximum is reached and output 63 begins to decrease. In this way the undesired inhomogeneity in the vicinity of the region of interest is effectively cancelled. Although only gradient currents are shown, for larger volumes of interest parabolic components such as $I_{px}$ and $I_{py}$ can also be driven by control signal generator 65 to further minimize homogeneity by maximizing signal 63.

As indicated, the peak of the frequency spectrum can alternatively be used to indicate spectral purity since inhomogeneity broadens and reduces the amplitude of each spectral line. Therefore, as shown in FIG. 5, the FID signal 34 is first Fourier transformed by DFT 61. The resultant spectrum is then peak detected in peak detector 62. This can simply be a digital operation which selects the largest peak of either the magnitude or the real part of the transform. The maximization of this peak signal output 64 proceeds exactly as previously described for signal 63.

The addition of corrective gradients will, in general, shift the frequency of the spectrum if the region being studied is anywhere except at the null point of the gradient. If this is undesirable for any reason, $B_0$ can be slightly changed to restore the spectrum to its original frequencies.

What is claimed is:

1. In a method for correcting magnetic field inhomogeneities in an NMR system the steps of:
   measuring the degree of homogeneity by measuring the duration of a received NMR signal following an excitation; and
   generating magnetic fields which substantially cancel the inhomogeneities so as to maximize the measured homogeneity.

2. Apparatus for correcting magnetic field inhomogeneities in an NMR system comprising:
   means for measuring the degree of homogeneity by measuring the duration of a received nmr signal following an excitation; and
   means for generating magnetic fields which substantially cancel the inhomogeneities and maximize the measured homogeneity.

3. Apparatus as described in claim 2 wherein the means for generating fields which substantially cancel the inhomogeneities includes the step of applying controlled gradient fields.

* * * * *